(12) United States Patent
Gevorgian et al.

(10) Patent No.: US 6,603,383 B2
(45) Date of Patent: Aug. 5, 2003

(54) MULTILAYER BALUN TRANSFORMER STRUCTURE

(75) Inventors: Spartak Gevorgian, Göteborg (SE); Charlotta Hedenäs, Göteborg (SE); Harald Jacobsson, Frölunda (SE); Håkan Berg, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 47 days.

(21) Appl. No.: 10/036,665

(22) Filed: Dec. 21, 2001

(65) Prior Publication Data

US 2002/0113682 A1 Aug. 22, 2002

(30) Foreign Application Priority Data

Dec. 22, 2000 (SE) ............................. 0004794

(51) Int. Cl.$^7$ .................................. H01F 5/00

(52) U.S. Cl. ...................... 336/200; 336/83; 333/25

(58) Field of Search ........................ 336/83, 65, 200, 336/223, 232, 208; 333/25, 26

(56) References Cited

U.S. PATENT DOCUMENTS

| | | | | |
|---|---|---|---|---|
| 4,816,784 A | * | 3/1989 | Rabjohn ..................... | 336/200 |
| 5,015,972 A | * | 5/1991 | Cygan et al. ............... | 336/200 |
| 5,061,910 A | | 10/1991 | Bouny | |
| 5,477,204 A | * | 12/1995 | Li ............................. | 336/200 |
| 6,097,273 A | | 8/2000 | Frye et al. | |
| 6,320,491 B1 | | 11/2001 | Gevorgian et al. | |
| 6,380,821 B1 | * | 4/2002 | Imbornone et al. ......... | 336/200 |
| 6,396,362 B1 | * | 5/2002 | Mourant et al. ............ | 336/200 |

FOREIGN PATENT DOCUMENTS

| | | |
|---|---|---|
| JP | 10-290107 A | 1/1999 |
| WO | 00/31893 A2 | 6/2000 |

OTHER PUBLICATIONS

S.P. Ojha, et al., "A Miniaturized Lumped–Distributed Balun for Modern Wireless Communication Systems", pp. 1347–1350, IEEE, 1997. No month.

R.H. Jansen, et al., "Improved compaction of multilayer MMIC/MCM baluns using lumped element compensation", pp. 277–280, IEEE, 1997; 1997 IEEE MTT-S Digest. No month.

(List continued on next page.)

Primary Examiner—Tuyen T. Nguyen

(57) ABSTRACT

The present invention relates to a multilayer, balanced-unbalanced signal transformer (20) comprising a first coil and a second coil providing at least one balanced signal port at one side of the balun transformer and an unbalanced signal port at another side of the balun transformer. The (at least one) balanced signal port is provided by a first balanced signal terminal ($23_b$) and a second balanced signal terminal ($24_b$) formed by the ends of the first coil. The unbalanced (single-ended) signal port is provided by a first unbalanced signal terminal ($21_u$) and a second unbalanced signal terminal ($22_u$). It comprises a discrete component formed on a low resistivity, e.g. semiconductor substrate layer, and the first and second coils are formed in, or constitute, a first and a second metal layer such that at least a portion of one of the coils is disposed in a metal layer, or constitute a portion of a metal layer, above the metal layer in which at least a portion of the other coil is disposed, or which is constituted, at least partly, by a portion of the other coil, wherein between said first and second metal layer and between said second metal layer and the substrate layer, first and second dielectric layers are disposed. Each of said first and second coils comprises three or less winding turns.

18 Claims, 11 Drawing Sheets

OTHER PUBLICATIONS

B. Pretham Kumar, et al., "A Reduced Size Planar Balun Structure for Wireless Microwave and RF Applications", pp. 526–529, IEEE, 1996. No month.

M. Engels, et al., "Modeling and Design of Novel Passive MMIC Components with Three and More Conductor Levels", pp. 1293–1296, IEEE, 1994; 1994 IEEE MTT–S Digest. No month.

Oscar Salonaho, et al., "Flexible Power Allocation for Physical Control Channel in Wideband CDMA", XP–000903286, IEEE 1999.

Masafumi Usuda, et al., "Optimizing the Number of Dedicated Pilot Symbols for Forward Link in W–CDMA Systems", XP–000986979, IEEE 2000.

* cited by examiner

MULTILAYER BALUN TRANSFORMER STRUCTURE

BACKGROUND

FIELD OF THE INVENTION

The present invention relates to balun transformers, in particular it relates to balun transformers with one or two balanced ports and an unbalanced port which have a small size, low microwave losses and which most particularly are suitable for Monolithic Integrated Circuit (MMIC) applications. Particularly they should be small enough for applications at low frequencies, particularly below about 10 GHz.

A balun (balanced-to-unbalanced) transformer is a (passive) two or three-port electronic circuit with a functionality of converting an unbalanced signal (unbalanced in relation to ground) into balanced signals and vice versa of converting balanced signals into an unbalanced signal. It is generally used for conversion between balanced (symmetrical) and unbalanced (non-symmetrical) transmission lines. A signal incoming to an unbalanced port may be divided between two balanced ports providing signals which have the same amplitude but phases differing 180° in relation to one another. Baluns may for example be used in transmitting circuits and receiving circuits of mobile communication devices, for construction of balanced amplifiers, mixers, VCOs (Voltage Controlled Oscillators), antenna systems etc.

Generally baluns are widely used in microwave devices and microwave systems. As referred to above, a balun can be used both as a two-port component and as a three-port component.

In FIG. 1 a (state of the art) two-port balun, or rather the lumped circuit equivalent of such a balun, is illustrated. The balanced port is formed between terminals T3 and T4 respectively, at which terminals the potentials are $V_3$ and $V_4$ respectively, of a primary coil whereas the unbalanced port is formed by terminals T1 and T2 respectively of a secondary coil. The potential at T2 of the unbalanced port is zero whereas T3 is not balanced, here having a potential denoted $V_u$. The unbalanced port may be connected to a microstrip, coplanar waveguide (CPW) or some other kind of unbalanced lines or components. For a two port component, the balanced port may be connected to components which have no ground plane on the back side of the substrate such as an inductor or a coplanar strip waveguide (CPS).

FIG. 2 shows a lumped circuit equivalent of a balun with a ground plane on the back of the substrate, i.e. of a three-port component. Again terminals T1 and T2 form the unbalanced ports with $V_2=0$ and $V_1=V_u$, T2 being connected to ground. A first balanced port, port $P_{b1}$, formed by terminals T3 at potential $V_3=V_b$ and T5 at potential $V_5=0$ (however, T5 does not have to be grounded, it may also be a fixed voltage) whereas the second balanced port, port $P_{b2}$, is formed by T4 and T5, wherein the potential at T4 is $V_4=-V_b$. The potentials at terminals T3 and T4 are 180° out of phase with respect to the terminal T5 and T5 corresponds to the ground plane on the backside of the substrate on which the balun is provided. For one three-port configuration component, T5 should be in galvanic contact with the ground plane. The balun of FIG. 2 may also be used in a two port configuration where the balanced port is formed between terminals T3 and T4, whereas terminal T5 may be galvanically connected to the ground plane, (although this is not necessarily the case). It may also be connected to a DC source.

In the past several attempts, using different approaches, have been made to reduce the size of a balun. For microwave frequency applications it is known to realize baluns on sections of transmission lines. In "Miniaturised Lumped-Distributed Balun for Modern Wireless Communication Systems, IEEE, MTT-S'77, pp. 1347–1350" by Ojha et al, a distributed microstrip balun is suggested which incorporates lumped capacitors to reduce the balun size. However, the balun is still large, it has a length exceeding 5 mm and it is also a narrow band (0.864–0.896 GHz) balun. It is also disadvantageous that the lumped capacitors have to be wire bonded which makes the design expensive.

In "A reduced Size Planar Balun Structure for Wireless Microwave and RF Applications, IEEE MMT-S'96, pp. 526–529" by Preetham et al, another design based on coupled microstrip lines is discussed in which the effective length enhancement of transmission lines is used by employing capacitive effects. In such a design no lumped capacitors are needed but the balun will still be a large, narrow band device which further is not compatible with MMIC technology.

In "Modelling and design of Novel Passive MMIC Components with Three and More Conductor Levels, IEEE MTT-S'94, pp. 1293–1296; Improved compaction of multilayer MMIC/MCM baluns using lumped element compensation, IEE MTT-S'97, pp. 227–280" by R. Jansen et al, baluns based on lumped inductors are proposed. Although it is possible to achieve a substantial reduction in size, which makes it possible to fabricate the baluns on semiconductor chips (MMIC) the losses would still be high if low resistivity silicon substrates were used.

Baluns may also be realized by transformers based on lumped inductors. It is for example known to realize baluns by ferrite transformers. However, the microwave losses would be high for such baluns and they are not suitable for applications in MMIC technology. Lumped inductor based transformers may be used to make small on-chip baluns in MMIC technology for low frequencies. However, for conventional silicon MMICs, the losses due to the high conductivity of the silicon used in standard manufacturing technology would be high.

Baluns based on sections of transmission lines, microstrip lines, CPW (Coplanar Waveguide) etc. generally have low microwave losses. However, they are large and that limits the possibilities of using them in MMIC applications, especially at low frequencies (less than 10 GHz). U.S. Pat. No. 5,061,910 shows a distributed balun. This balun requires a plurality of conductor elements of $\lambda/4$ length. This means that the balun will be large. Thus, also the balun disclosed therein is not small enough and not applicable at low frequencies. Further yet it is not appropriate for MMIC implementations.

SUMMARY

What is needed is therefore a balun transformer which is small and which has a good performance. The performance is given by the insertion losses, the reflection losses and the bandwidth. Thus a balun is needed which has low insertion losses, low reflection losses and a large bandwidth. Particularly a balun transformer is needed which is small enough to enable practical applications in MMIC. Still further a balun is needed which can be used for microwave frequencies which are low, particularly below about 10 GHz. Still further a balun transformer is needed which is easy and cheap to design, and fabricate, and which is compatible with MMIC technology for frequencies below 10 GHz. Particularly a small size, low loss balun is needed which is compatible with standard silicon MMIC production technology without requiring introduction of additional masks and processing steps. Generally a wideband balun transformer is needed which has a small size, and which can be produced on low resistivity substrates, i.e. substrates with a high conductivity such as for example silicon as used in conventional IC production.

Therefore a multilayer balun signal transformer is provided which comprises a coil system comprising a first coil and a second coil providing at least one balanced signal port at one side of the balun transformer and an unbalanced signal port at another side of the balun transformer, wherein the at least one balanced signal port is provided by a first balanced signal terminal and a second balanced signal terminal formed by the ends of the first coil, the unbalanced (single-ended) signal port being provided by a first unbalanced signal terminal and a second unbalanced signal terminal. The balun is a discrete component and it is formed on a low resistivity, e.g. a semiconductor, substrate layer, and the first and the second coils are formed in, or constitute a first and a second metal layer, wherein between said first and second metal layer and between said second metal and the substrate layer, first and second dielectric layers are disposed. The coil system comprises two (interconnected) discrete coils and at least a portion of one of the coils is disposed in or constitute a metal layer above the metal layer in which at least a portion of the other coil is disposed, or which is constituted by at least a portion of the other coil.

In the following, when referring to coils in a metal layer it may, or generally is meant, that the coils/portions of coils constitute a metal layer/portion (part) of a metal layer.

In a particular implementation the balun transformer is formed directly on the low resistivity substrate layer. Particularly the substrate layer comprises a thin film or bulk semiconductor substrate, e.g. of silicon and the balun transformer is implemented as a MMIC. In a particular implementation each of said first and second coils comprises three or less winding turns. In a most advantageous implementation each of said first and second coils comprises one winding turn each.

In a particular, advantageous implementation, allowing a particularly high input to output coupling and equal impedance of the ports, the first and second coils are arranged symmetrically with respect to the substrate layer. Particularly a first portion of each of said coils are provided in one of said first and second layers whereas the second portions of said first and second coils are provided in the other of said first and second layers whereby via connections are used to interconnect the first and second portions of the respective coils. It is supposed to be well known in the art that a via connection is an aperture formed in a multilayer structure which is plated with conductive material to establish electrical connections at desired points between different layers in the multilayer structure.

Such an implementation is advantageous in that the impedances of the ports will be substantially equal and in addition thereto, the input/output coupling will be even better.

In an alternative embodiment the entire first coil is provided in, or constitute, one of the metal layers whereas the entire second coil is provided in, constitute, the other metal layer. Irrespectively of whether each coil is provided in, constitute, a separate metal layer or if one portion of each coil is provided in one metal layer and the other portion in another metal layer, a capacitor may be integrated in parallel with at least one of the signal terminals, advantageously with at least one of the balanced signal terminals. In alternative implementations a capacitor is integrated in parallel with two or three of the balanced signal terminals and in still other implementations a capacitor is integrated in parallel with each one of the signal terminals. Through introducing capacitors in parallel with the inductors (formed by the signal terminals) the matching between input and output impedances is improved. Such a capacitor, in parallel with the inductor (terminal) will form a resonant tank or a resonant circuit. The impedance of such a circuit may be adjusted by properly selecting inductance and capacitance values. In order to have a transformer having the same input and output impedance, the condition $L_1=L_2=M$ should be fulfilled, or in other words the inductance of the first coil should be the same as the inductance of the second coil, which should be the same as the mutual inductance between the coils. According to the invention the capacitors may be used to enable a proper control of inherent parasitic capacitances of the coils allowing a substantial size reduction and full on-chip integration in standard silicon technology.

In one advantageous implementation the first and second dielectric layers comprise low loss dielectricas such as e.g. $SiO_2$ or a similar material, e.g. any appropriate bulk or thin film semiconducting material. According to one implementation the first portion of the first coil and the first portion of the second coil are provided in the same first metal layer, their respective first portion constituting the respective signal terminals in an alternative implementation the first portion of the first coil and the first portion of the second coil are provided in the second metal layer, said first portions constituting the respective signal terminals. Particularly the second unbalanced terminal of the second coil is connected to ground, i.e. has zero potential.

In an alternative implementation the first coil is provided in the first layer whereas the second coil is provided in the second layer or vice versa. The potentials at the first and second balanced terminal are particularly equal and opposed, which means that at the midpoint between theme the potential is zero, and said point may be used as a virtual ground, e.g. the second terminal for the unbalanced port, it merely, together with the first unbalanced terminal, forms the unbalanced port. The virtual ground may be connected by a via to the second terminal of the second coil. It is an advantage of such a design that no via connection is required from the first unbalanced terminal to the ground plane which enables a simple design and fabrication. Furthermore, since there is no via connection, the parasitic inductances and capacitances associated therewith will be excluded which will further assist in improving the electrical performance of the balun. Still further, substrate losses will be low since there will be a reduction in induced substrate currents. First, the longitudinal substrate currents induced by the coil strips will almost cancel each other since the currents in the upper and lower, i e. the first and second coils, are equal in magnitude and oppositely directed. However, the canceling of the substrate currents will not be entirely perfect since the distance from the upper coil strip to the substrate will not be the same as the distance from the lower coil strip to the substrate. Partial canceling may also be due to the differences in the thickness and width of the upper and bottom strips. Such partially balanced substrate currents flow in opposite directions and the substrate currents will may be reduced further by choosing the optimum distance between opposing branches of the coils as disclosed in the Swedish patent application "Balanced inductor", application number 9901060-5 filed 990323 by the same applicant and which herewith is incorporated herein by reference.

In one particular implementation, relevant for all embodiments as described above, the/each capacitor comprises a varactor, e.g. a semiconductor varactor, a ferroelectric varactor or a microelectromechanical varactor. Varactors can be used to enable a (better) adjustability of the frequency band. Such adjustable capacitances may also be used to take care of fabrication tolerances etc.

According to the invention it is possible to design the balun and select the values of the capacitor(s) to shift the passband within a frequency range such that a desired passband can be selected.

Through the introduction of capacitors, the bandwidth of the balun will be somewhat reduced as compared to the case when there are no capacitors. However, for most applications, even if there is provided a capacitor for each one of the terminals, the bandwidth will be satisfactory. Particularly it is possible to realize on-chip baluns for frequencies down to at least 5 GHz which particularly have a size of about 0.1 $mm^2$ or even smaller than that.

According to the invention a discrete balun, in which each coil has a low number of winding turns, is provided, particularly only one winding turn for each coil, which will give an input impedance similar to the output impedance in parallel with an inductor. Advantageously there is one capacitor on the input and one on the output to remove the inductive part of the impedance. It is possible to connect such a capacitor only to the in- or the output even if it is particularly advantageous to connect capacitors on both sides. However, to provide a particularly small balun, it is possible to provide a capacitor only on one side, and particularly integrated with only the one of the terminals. This is not possible for distributed baluns. Various implementations of the inventive balun transformer are possible and it can be used for several applications. In one particular embodiment, the balanced terminals are connected to a balanced transmission line, e.g. a coplanar strip line whereas the unbalanced terminals are connected to an unbalanced transmission line, e.g. a microstrip line or a coplanar waveguide.

In a particular implementation the size of the balun is less than about 0.1 $mm^2$.

It is an advantage of the invention that, in addition to other advantages mentioned in the foregoing, a balun what is much smaller than hitherto known baluns can be provided which in addition thereto is a wideband device and which may be produced on high conductivity substrates such as for example silicon used in standardised production of integrated circuits, particularly MMIC.

BRIEF DESCRIPTION OF THE DRAWINGS

The invention will in the following be further described in a non-limiting manner and with reference to the accompanying drawings in which.

DETAILED DESCRIPTION

Figure 1:
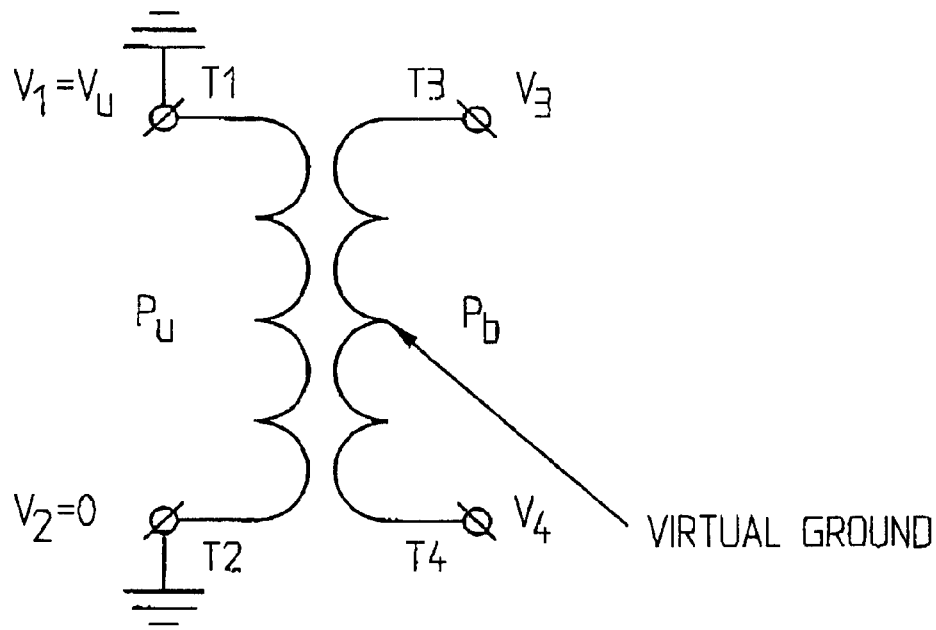
FIG. 1 schematically illustrates a lumped circuit equivalent of a two-port balun, FIG. 2 schematically illustrates a lumped circuit equivalent of a balun with a ground plane on the back of the substrate, i.e. of a three-port component.
Figure 2:
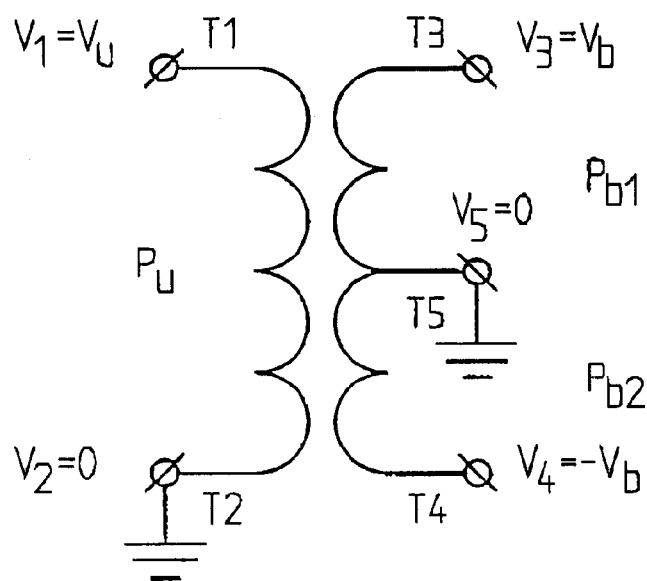
Figure 3:
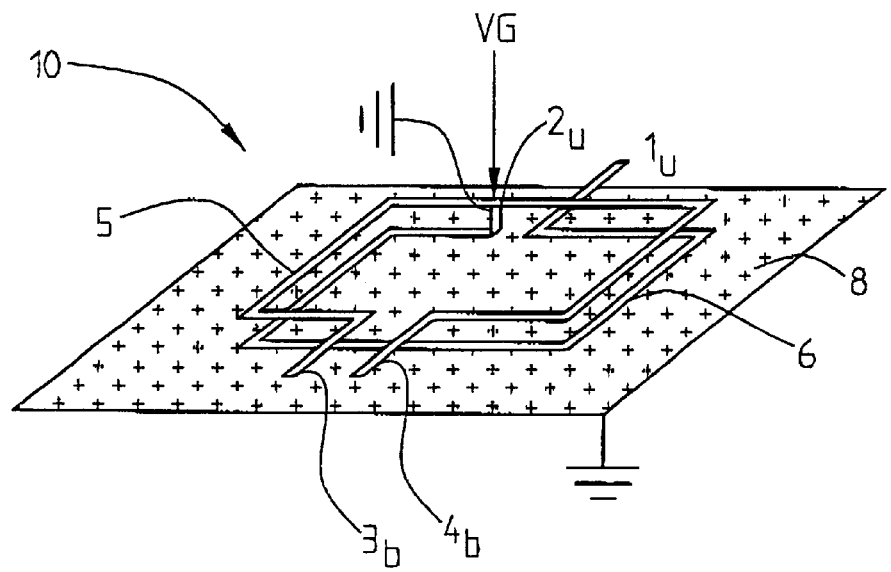
FIG. 3 schematically illustrates a first embodiment of a balun transformer according to the invention, FIG. 4 schematically illustrates a cross-section of the balun of FIG. 3 in an embodiment in which the first and second coils are compressed to cancel/reduce substrate currents, FIG. 5A schematically illustrates an implementation of a balun as in FIG. 3 for providing coupling between an unbalanced coplanar waveguide and a balanced coplanar strip line.

In FIG. 3 a balun 10 according a first embodiment of the invention is illustrated. The balun is formed by two inductive loops, i.e. a first coil 5 and second coil 6 (a primary coil and a secondary coil respectively) in (constituting) two metal layers. Between the metal layers comprising the inductive loops, i.e. the first and second coils 5,6 respectively, a first dielectric layer, e.g. of silicon oxide or any other low loss dielectric material, is provided and between the second metal layer comprising the second coil 6 or the strip comprising the coil and a substrate layer, a second dielectric layer, particularly of the same kind as the first dielectric layer, is provided. The dielectric layers as well as the substrate layer on which the dielectric layers and metal layers comprising a balun 10 are formed, are not shown for reasons of simplicity.

The substrate is particularly a high conductivity or low resistivity substrate, e.g. of silicon. The first coil 5, hero the upper coil, comprises a first balanced terminal $3_b$ and a second balanced terminal $4_b$ forming the balanced port. The potential at point VG is equal to zero since the potentials at the terminals $3_b$ and $4_b$ are equal but opposed. Since VG has zero potential, this point may be used as a virtual ground and it may be used as a second unbalanced terminal $2_u$ of the second, lower coil 6, of which first and second terminals $1_u$ and $2_u$ respectively form the unbalanced port. Thus, the first unbalanced terminal $1_u$ forms the unbalanced port of the balun in relation to the virtual ground here constituting the second unbalanced terminal $2_u$. The virtual ground point VG is particularly connected by a via to the terminal $2_u$.

Figure 4:
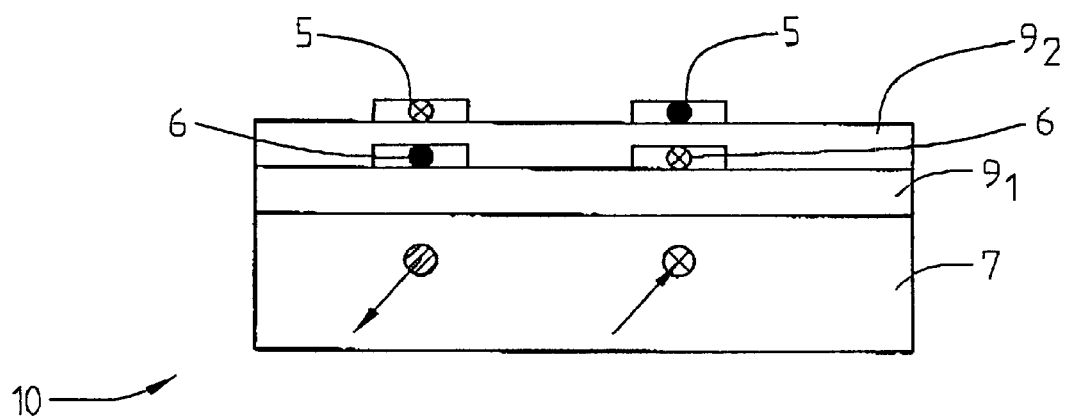

It is an advantage of this embodiment that no via connection from the second unbalanced terminal $2_u$ to the ground plane 8 is required which means that a particularly simple design allowing a simplified fabrication is provided. It is also an advantage that, since it is not necessary to have a via connection to the ground plane, the electrical performance of the balun will be good since parasitic inductances and capacitances associated with such a via connection will not be present. It is also advantageous that the losses in the substrate will be reduced due to the fact that substrate currents only are produced to a minor extent. Although some longitudinal substrate currents are produced by the strips, comprising the coils they will almost cancel each other since the current in the upper and the lower coils respectively will be equal in magnitude and opposed in direction. Substrate currents are still produced to some extent since the distances from the upper coil/strip to the substrate and from the lower coil/strip to the substrate respectively are not equal. That the canceling is not perfect may also result from the fact that there are often differences in thickness and width of the upper and bottom strips or metal layers comprising the coils. Generally the upper layer is thicker. FIG. 4 shows that such partially balanced substrate currents flow in opposite directions as indicated by the arrows. It is possible to further reduce the substrate currents by choosing the optimum distance between opposing branches of the coils in a way as discussed in the patent application which was incorporated herein by reference thereto. This document teaches that if the coils are compressed as indicated by the arrows A in the figure and if the compression is done to the appropriate extent, i.e. to affect the distance between the branches of the respective coils, the substrate currents will substantially cancel each other.

FIG. 4 thus shows the opposed branches 5,5 of the first coil, the second dielectric layer $9_2$ between the first coil 5 and the second coil 6, the first dielectric layer $9_1$ between the second coil 6 and the substrate layer 7 in which the substrate currents are produced and which should be balanced to the largest possible extent.

Figure 5A:
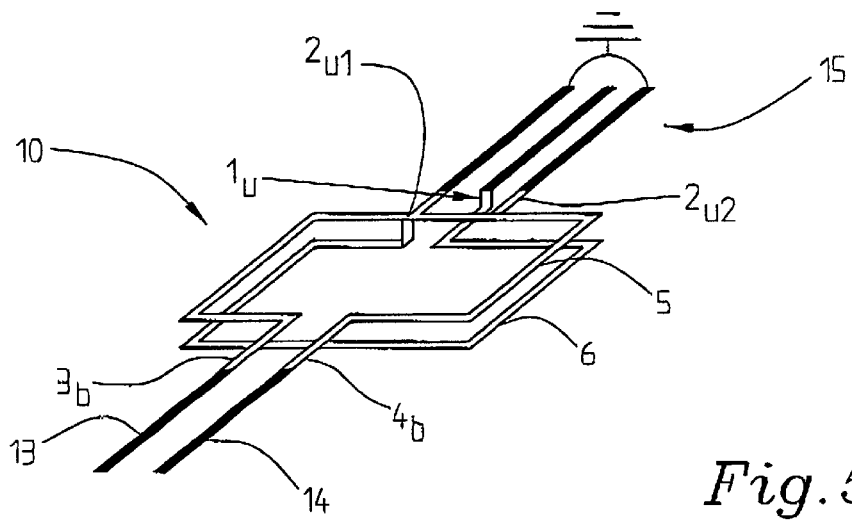
FIG. 5B shows another implementation of the balun of FIG. 3 for providing coupling between an unbalanced microstrip and a balanced coplanar strip line.
FIG. 5C shows still another implementation of the balun according to FIG. 3 for providing coupling between an unbalanced microstrip and a balanced coplanar strip line.
Figure 5B:
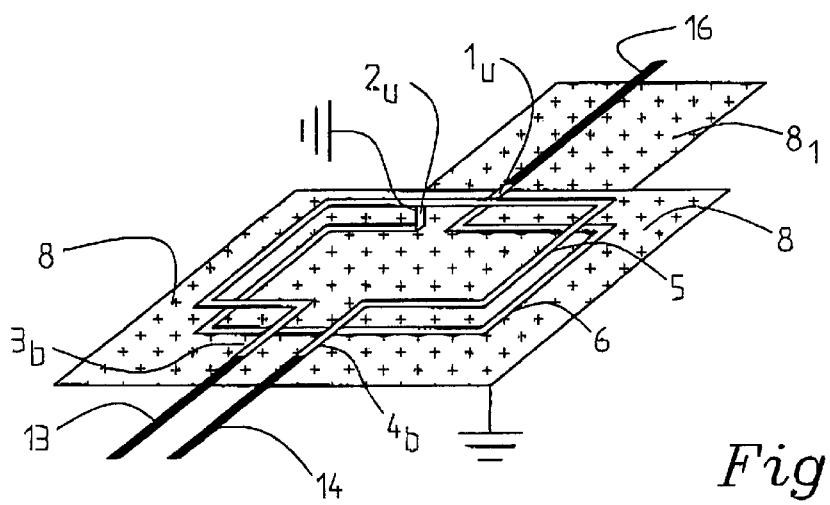
Figure 5C:
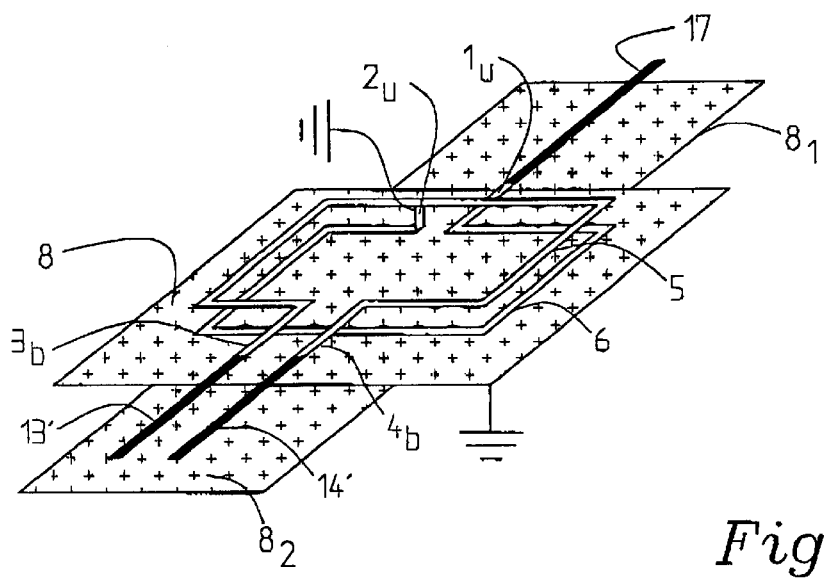
Figure 8A:
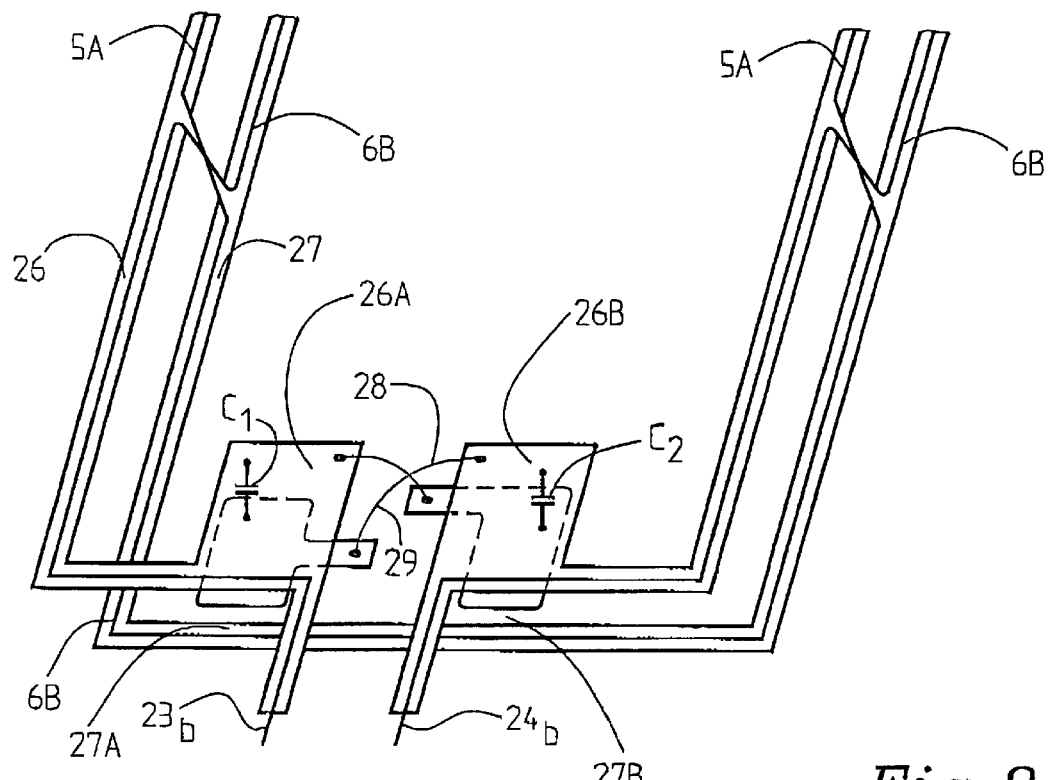
FIG. 8A is a side view of a balun (according to FIG. 6) showing integrated capacitors on the balanced side.
Figure 8B:
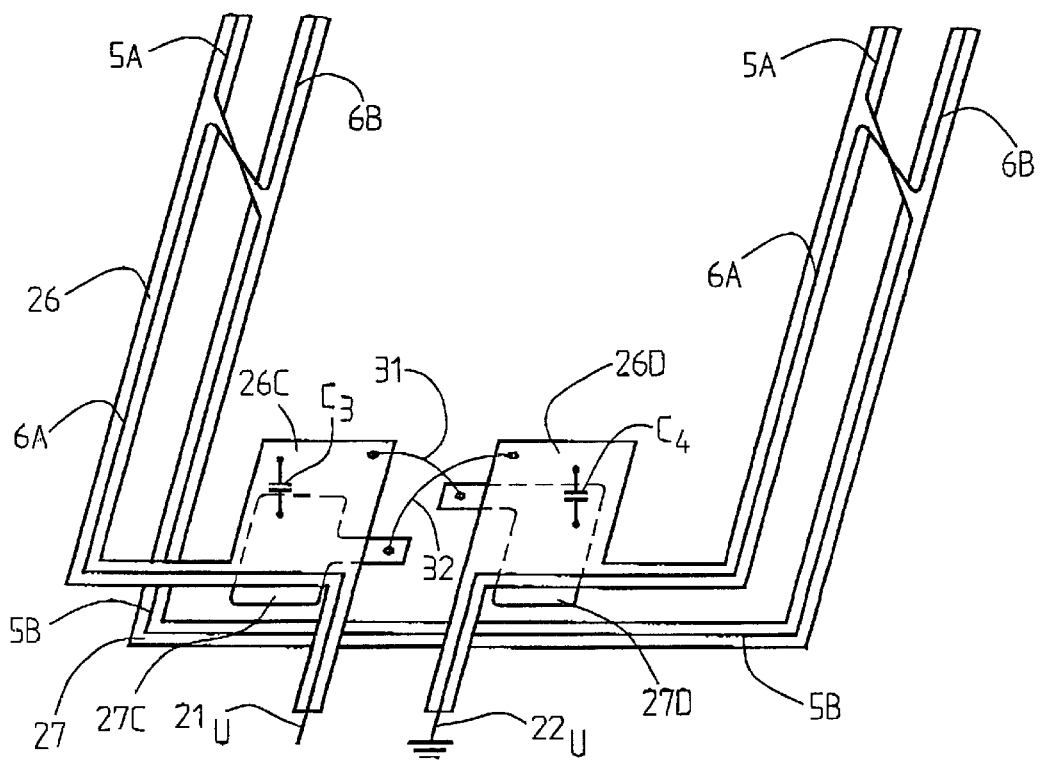
FIG. 8B is a view from the other side of a balun (according to FIG. 6) showing integrated capacitors on the unbalanced side.

FIGS. 5A–5C illustrate examples on how the balun can be used for providing coupling between balanced transmission lines and unbalanced transmission lines. In FIGS. 5A–5C three different two-port applications are illustrated. The impedances of the ports are not the same since the first and the second coils, i.e. the upper and the lower coils, are not symmetric with respect to the substrate layer. In order to get a balun transformer having the same input and output impedance, the inductance of the first coil should be the same as the inductance of the second coil which in turn should be the same as the mutual inductance between the coils. In order to improve the matching between the input and output impedances respectively, a capacitor is preferably introduced in parallel with the respective inductors, i.e. with their respective balanced and unbalanced terminals. In one implementation there is one capacitor in parallel with one of the terminals only; there may also be two or three capacitors in parallel with each a terminal/inductor or one capacitor for each terminal. Such a capacitor in parallel with an inductor form a resonant circuit, i.e. they are used to form a resonant tank. The impedance of such a circuit may be adjusted by choosing both inductance and capacitance values. Advantageously the, or each, capacitors is utilized for a proper control of inherent parasitic capacitances of the coils to allow substantial size reduction and full on-chip integration using a standard silicon technology. For reasons of clarity the capacitors are not illustrated in FIGS. 4, 5A–5C but in FIGS. 8A, 8B is illustrated how capacitors can be integrated with the conductors of the coil terminals of a balun of a second embodiment. It should be clear that capacitors could be, with advantage, integrated with the inductors or terminals of the balun as disclosed in FIG. 3 (and FIGS. 5A–5C).

It is possible to realize very small and cheap baluns for frequencies down to at least 5 GHz. The capacitorcs) will to some extent reduce the bandwidth of the balun. However, for most applications, the bandwidths obtained, also when capacitors are included, will be large enough. One example on such an application is a voltage controlled oscillator (VCO). Other applications are of course also possible such as amplifiers/mixers etc.

The balun in FIG. 5A is used to provide coupling between a coplanar strip line 13,14 which is balanced, and a coplanar waveguide 15 which is unbalanced. The first and second balanced terminals $3_b$, $4_b$ are connected to the strip lines 13,14 whereas the first unbalanced terminal $1_u$ is connected to the central strip of the coplanar waveguide whereas the external strips of the coplanar waveguide are connected to the second "unbalanced" terminal $2_{u1}$ and to a further, grounded terminal $2_{u2}$ on the first coil. The unbalanced port is thus formed between a first unbalanced terminal $1_u$ and unbalanced (grounded) terminals $2_{u1}, 2_{u2}$. In this embodiment there is no ground plane on the back of the substrate. Again, for reasons of clarity, the substrate below the coils/strips and the dielectric layers are not shown.

FIG. 5B shows an implementation in which the balun 10 is used to provide coupling between a balanced coplanar strip line 13', 14' and an unbalanced microstrip 16. The reference numbers are the same as those in FIG. 5A but in this case there is a ground plane $8_1$ below the unbalanced microstrip line 16, and a ground plane 8 under the balun substrate. Under the coplanar strip line 13',14' there is however no ground plane. Also in this case the substrate layer and the respective dielectric layers are riot illustrated for reasons of clarity.

FIG. 5C shows an implementation in which the balun 10 is used to couple an unbalanced microstrip line 17 with a coplanar strip fine 13",14" which is balanced. The strips 13",14" of the balanced coplanar strip line are connected to the first and second balanced terminals $3_b$, $4_b$ respectively. The unbalanced microstrip line 17 is connected to the first unbalanced terminal $1_u$ which forms the unbalanced port with the second unbalanced terminal $2_u$ connected to ground, or virtual ground (or a fixed potential), There is a ground plane below the balun 8, and a ground plane $8_1$ below the microstrip line and an additional ground plane $8_2$ under the coplanar strip line. Also in this embodiment the substrate layer and the dielectric layers are not shown for reasons of clarity.

Figure 6:
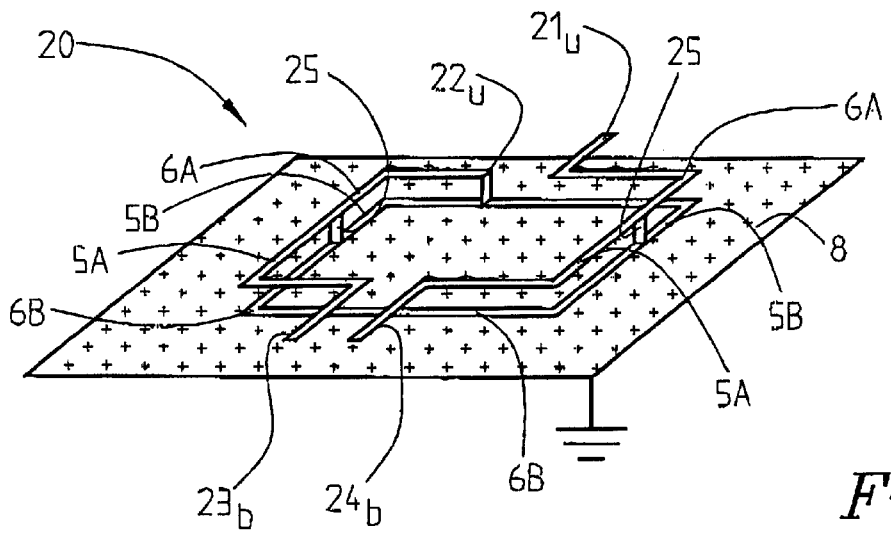
FIG. 6 shows an alternative embodiment of a balun transformer according to the invention in which the coils are symmetrical with respect to the substrate layer.

FIG. 6 shows an alternative embodiment of a balun transformer 20. A first, a primary, coil comprising one winding turn or an inductive loop here comprises a first portion 5A and a second portion 5B. The first portion 5A is provided in a first metal layer, here the upper metal layer, and it comprises the first and second balanced terminals $23_b, 24_b$ The second portion 5B of the first coil is provided in the second, lower, metal layer and it is connected to the first portion 5A by via connections 25,25. In a similar manner the second or secondary coil, also comprising one winding turn, comprises a first portion 6A comprising the first and the second unbalanced terminals $21_u, 22_u$, which first portion 6A is located in the first, here, upper metal layer whereas the second portion 6B is provided in the second, lower, metal layer (thus below the first portion 5A of the first coil). In this embodiment both the first and the second, balanced and unbalanced, terminals respectively are thus provided in the first, here upper, metal layer whereas the second portions of the respective coils are provided in the second, here lower, metal layer. The first and the second portions 6A, 6B of the second coil are also interconnected by the via connections 25,25.

In this manner a balun is provided having two coils which are symmetric with respect to the substrate layer (for reasons of clarity the substrate layer is not shown in the figure). Also in this embodiment there is a dielectric layer between the substrate layer and the second, lower, metal layer and another dielectric layer is provided between the first and the second metal layers (also not shown).

The impedances of the input and output ports, the balanced and unbalanced ports respectively, will be substantially the same since the coils are symmetric with the respect to the substrate/ground. The impedances of the ports will be equal, and the input/output coupling will be very good.

Also in such a symmetric implementation is possible to add one or more capacitors in parallel to one or more of the balanced/unbalanced terminals. The capacitance(s) are used to remove the inductive part of the input impedance. As referred to earlier in the application, instead of conventional capacitors, it is possible to use varactors, i.e. variable or adjustable capacitors such as for example semiconductor varactors, ferroelectric varactors or microelectromechanical varactors. Since the primary and the secondary coil will have the exactly the same inductance independently of the substrate the coupling will be higher than for the baluns of embodiments in which the inductances differ. This makes it even more easy to make a balun on a substrate with a high conductivity or on top of a ground plane, cf. FIGS. 5B, 5C. In a particular implementation the balun will have a size which is smaller than 0.1 mm² or smaller than that. Particularly it has a size of about 0.05 mm² which is much smaller than conventional baluns based on quarter wavelength transmission lines which have sizes or 0.5 mm² or larger.

Figure 7A:
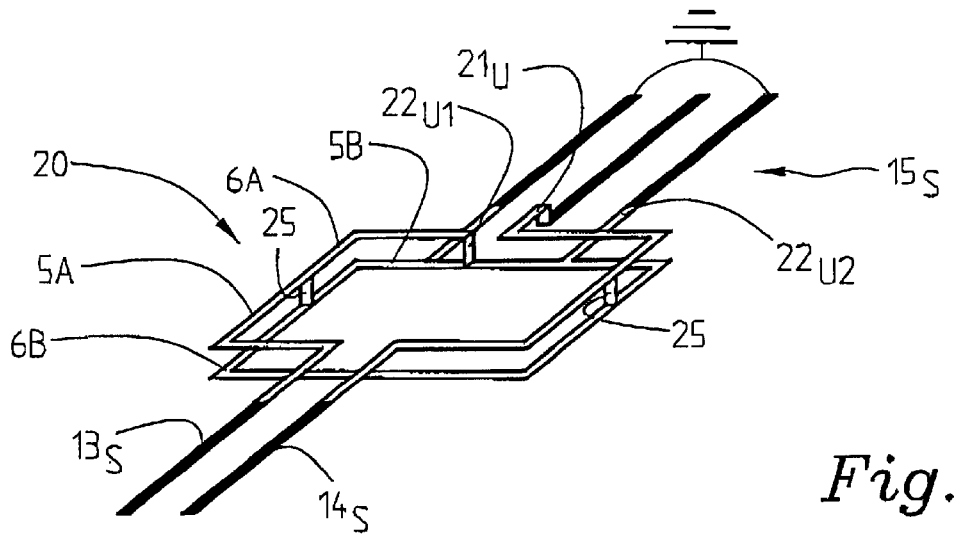
FIG. 7A is a figure similar to that of FIG. 5A but for the balun having coils which are symmetrical with respect to the substrate as in FIG. 6.
Figure 7B:
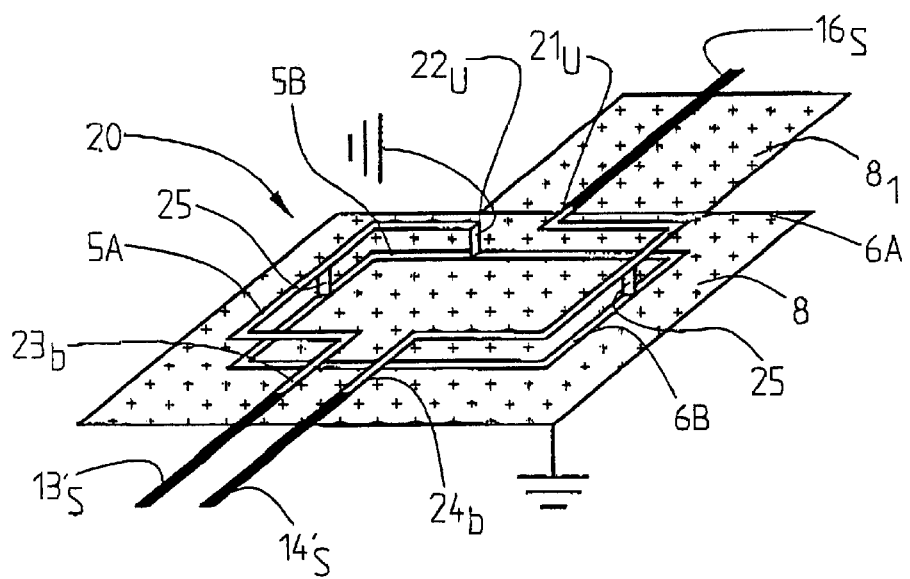
FIG. 7B is a figure similar to that of FIG. 5B but with a balun as in FIG. 6.
Figure 7C:
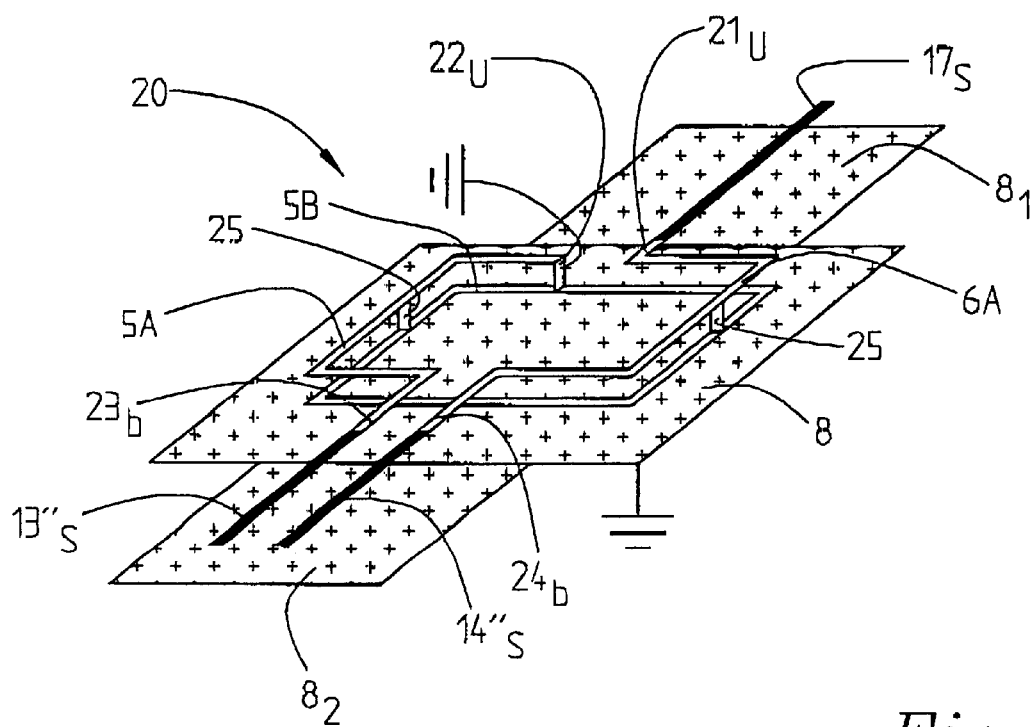
FIG. 7C is a figure similar to that of FIG. 5C but for the balun of FIG. 6.

FIGS. 7A–7C are similar to FIGS. 5A–5C but for a balun as disclosed in FIG. 6, i.e. a balun with first and second coils which are symmetric with respect to the substrate layer/ ground Thus FIG. 7A shows an arrangement in which a symmetric balun 20 provides coupling between a coplanar waveguide, which is unbalanced, with a coplanar strip line, which is balanced, FIG. 7B shows an arrangement in which a balun 20 is used to couple an unbalanced microstrip line with a balanced coplanar strip line and finally FIG. 7C shows an arrangement in which a balun 20 is used to couple an unbalanced microstrip line with a coplanar strip line which is balanced.

FIG. 8A schematically illustrates an embodiment in which capacitors are integrated in parallel with the first and the second balanced terminals of a balun as in FIG. 6 whereas FIG. 8B shows capacitors connected in parallel with the first and second unbalanced terminals of the second coil of the balun of FIG. 6.

FIG. 8A shows the part of the balun 20 comprising the balanced port formed by the balanced terminals $23_b, 24_b$, i.e. by the first portion 5A of the first (primary) coil. The first portion 5A of the first coil is provided in a first upper metal layer 26 and the second portion 6B of the second (secondary) coil is provided in a second, lower metal layer 27. The first portion 5A of the first coil is connected to the second portion 5B of the first coil which is disposed in the lower metal layer 27 through via connections 25, which also are used as vias connecting the first portion 6A (in the upper metal layer 26) with the second portion 6B (in the lower metal layer) of the second coil.

The first (upper) metal layer and the second (lower) metal layer particularly comprise upper and lower metal strips. The first metal strip forming the first metal layer 26 is provided with first and second protrusions or enlarged portions 26A,26B adjacent, but oppositely directed to the balanced terminals. First and second portions 27C,27D are disposed below said first layer enlarged portions 26A,26B respectively. The first enlarged portion 26A of the first metal layer 26 is interconnected with the second portion 27B at the level through via 28 and correspondingly the first lower portion 27A (at the level of the second layer 27) is connected to the second upper enlarged portion 26B of the first layer 26 through via 29 to form capacitors.

A first integrated capacitor is thus provided in parallel with the first balanced terminal $23_b$, and a second integrated capacitor is provided in parallel with the second balanced terminal $24_b$. The capacitors are indicated as $C_1$ and $C_2$ in the figure for illustrative purposes; it should be clear that there is no capacitor connected between the upper and lower enlarged portions, but there is a capacitance of size $C_1$ ($C_2$) between the respective upper and lower enlarged portions.

FIG. 8B correspondingly illustrates the capacitances $C_3$, $C_4$ between the third enlarged portion 26C of the first metal layer 26 and a third portion 27C at the level of the second metal layer, and between a fourth enlarged portion 26D of the first metal layer 26 and a fourth portion 27D at the level of the second metal layer 27 respectively. The capacitors thus formed are integrated in parallel with the first and second unbalanced terminals $21_u, 22_u$.

Via connections 31,32 are used to interconnect the upper enlarged portions 26C,26D with the opposite, lower, portions 27D,27C respectively. In other aspects the figure is similar to that of FIG. 8A.

In FIGS. 8A,8B the coils (coil portions) do actually constitute the metal layer/strips instead of being formed in the strips. in alternative embodiments only one, two or three or the illustrated capacitors is/are actually provided. The capacitance is then correspondingly higher; i.e. if $C_1, \ldots C_4$ each has a capacitance of 0,5 pF, in one embodiment with only one capacitor, said capacitor would have a capacitance of about 2 pF if there were just one capacitor. The invention is of course not limited the these values, they are merely give for illustrative purposes.

The performance of a balun can be expressed in terms of insertion losses, reflection losses and bandwidth. The insertion losses are usually given by the $S_{21}$ and $S_{21}$, parameters which are defined as:

$S_{21}$=(Energy received at port 2)/(Energy fed to port 1)

$S_{31}$=(Energy received at port 3)/(Energy fed to port 1)

when the other port, port 3 or 2, is terminated by a matched load. These parameters should be as close to unity as possible. Port 1 here refers to the unbalanced port whereas ports 2 and 3 are the balanced ports, i.e. it is referred to a three-port component. The reflection losses are given e.g. by the $S_{11}$ parameter which is given by $S_{11}$=(Energy reflected to port 1)/(Energy fed to port 1)

when the two other ports are terminated by matched loads. $S_{11}$ should be as small. as possible and the bandwidth should be as large as possible.

If a balun is represented as a two-port component, the Z-parameters (the representation of the impedance) will be as follows:

$$Z = \begin{pmatrix} R_1 + j\omega L_1 & j\omega M \\ j\omega M & R_2 + j\omega L_2 \end{pmatrix}$$

wherein $R_1$ is the resistance of the unbalanced port, $L_1$ the inductance of the unbalanced port, $R_2$ and $L_2$ being the resistance and the inductance respectively of the second, balanced port. M is the mutual inductance. The input impedance of port 1 may be written as:

$$Z_{in} = Z_{out} \frac{\omega^2 M^2}{Z_{out}^2 + \omega^2 L_2^2} + j\left(\omega L_1 - \frac{\omega^3 M^2 L_2}{Z_{out}^2 + \omega^2 L_2^2}\right)$$

Figure 9A:
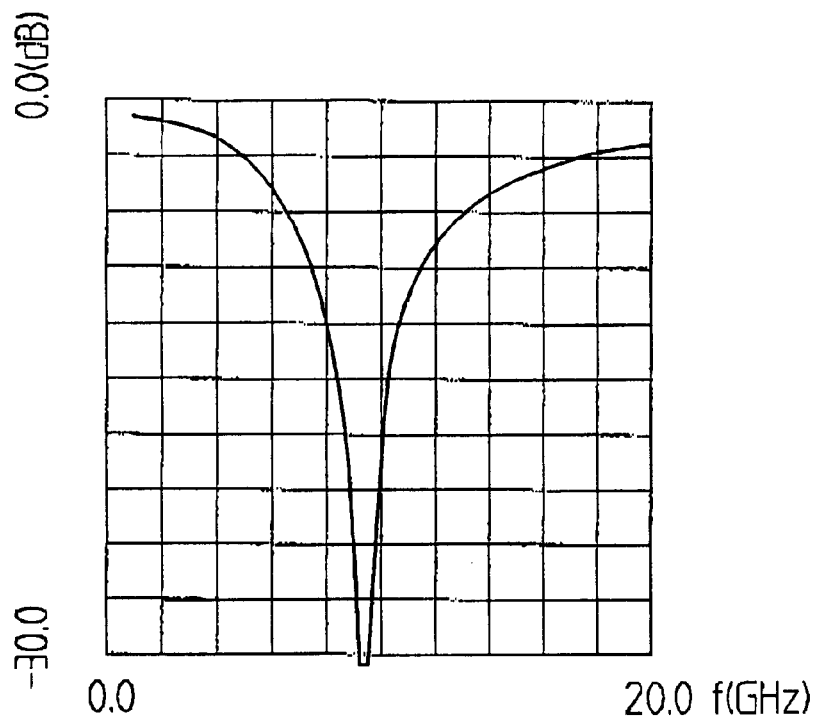
FIG. 9A is a graph illustrating the reflection of a signal at the balanced port when received from the unbalanced port of a balun with integrated capacitors.

This equation is valid for a real output impedance. It can be seen that for a high inductance of the secondary coil the output impedance can be neglected. To have the input impedance real, the following condition should be fulfilled: $L_1 L_2 = M^2$ FIG. 9A is a graph illustrating the reflection losses in dB in the balanced port when a signal is sent from the unbalanced port to the balanced port.

Figure 9B:
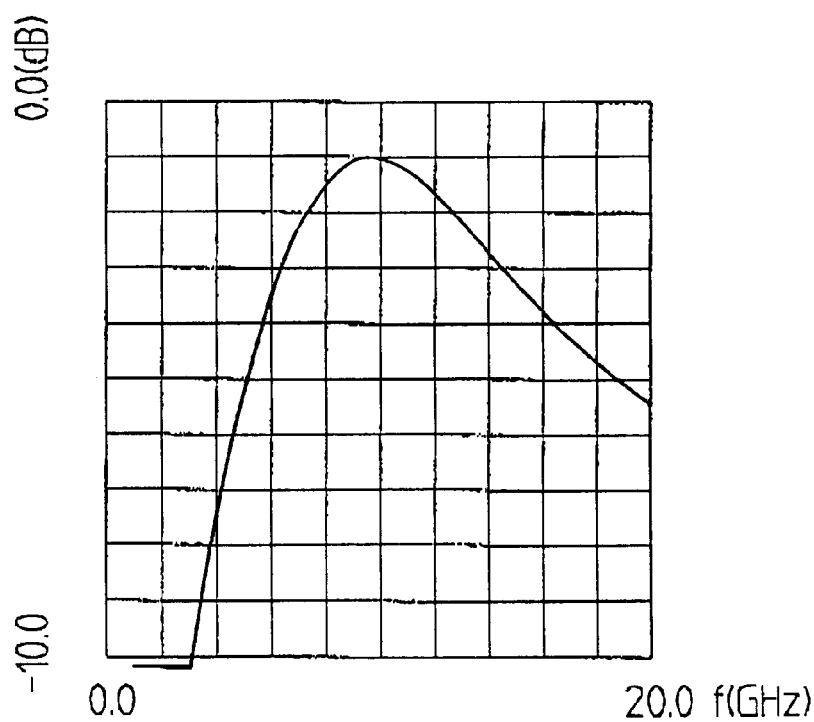
FIG. 9B is a graph illustrating the transmission when a signal is transmitted from the unbalanced side to the balanced side for the balun as in FIG. 9A.
Figure 9C:
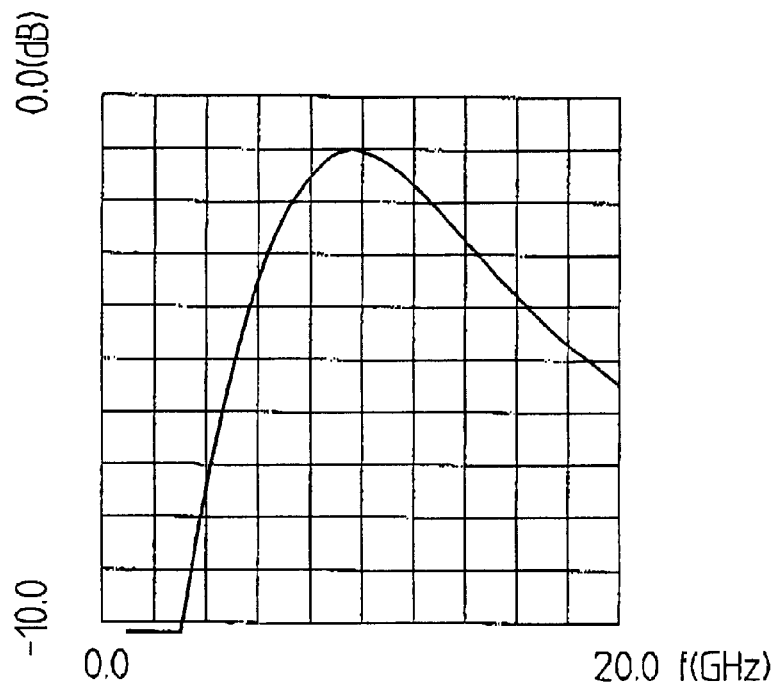
FIG. 9C is a graph illustrating the transmission when a signal is sent from the balanced side to the unbalanced side for the balun in FIG. 9A.
Figure 9D:
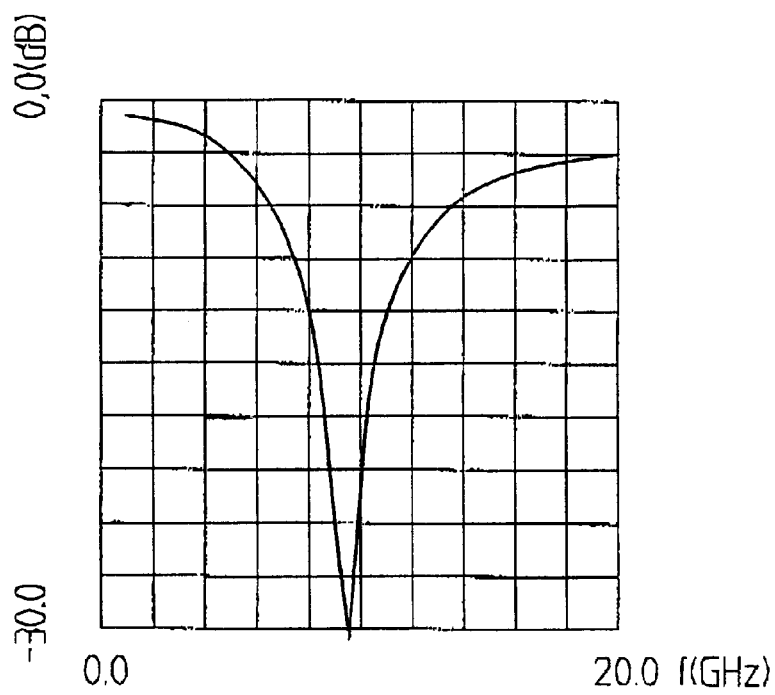
FIG. 9D is a graph illustrating the reflection of a signal sent from the balanced port to the unbalanced port for the balun with integrated capacitors as in FIG. 9A, FIGS. 10A–10D are graphs similar to those of FIGS. 9A–9D but for a balun without capacitors.
Figure 10A:
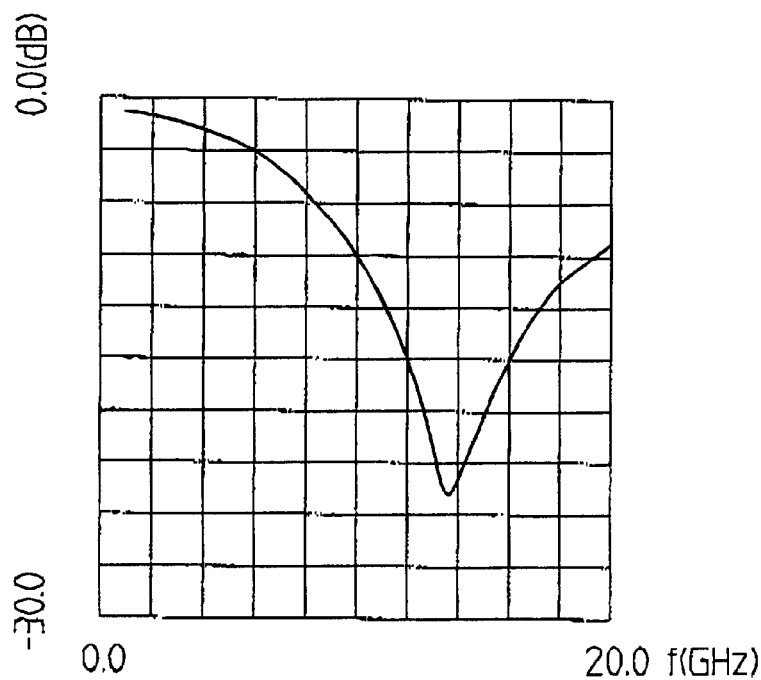
Figure 10B:
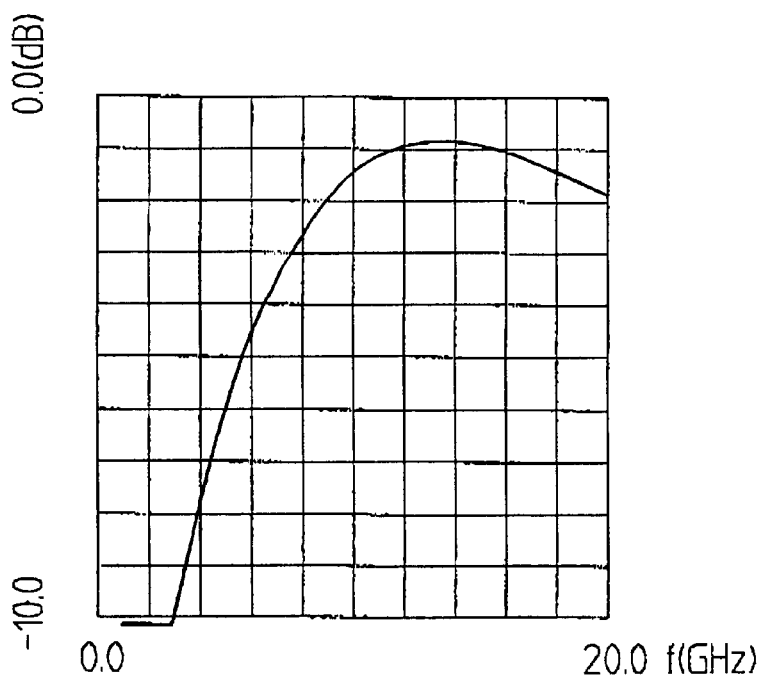
Figure 10C:
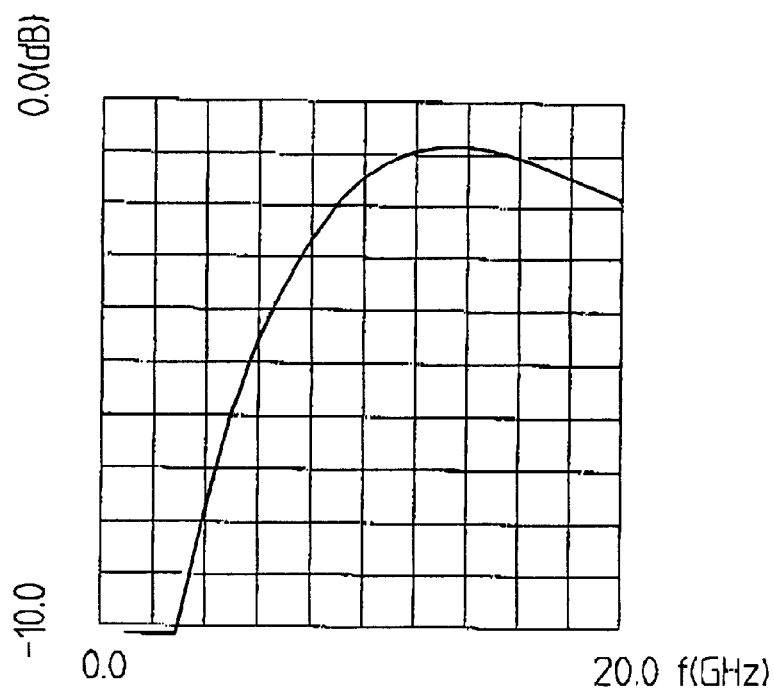
Figure 10D:
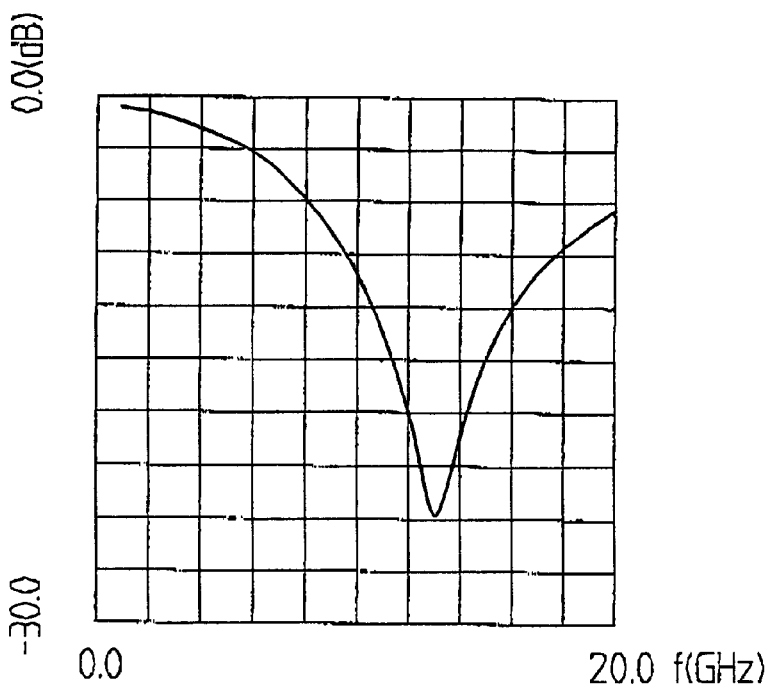

FIG. 9B illustrates how much of the signal., in dB, that is transmitted from the unbalanced to the balanced port for a balun as in FIG. 6. Correspondingly FIG. 9C illustrates the transmission when a signal is sent from the balanced port to the unbalanced port whereas FIG. 9D illustrates the reflection at the unbalanced port when a signal is sent from the balanced port to the unbalanced port.

The transmission will be the same in both directions whereas the reflectivity differ somewhat from one direction to the other. The values on reflection and transmission are obtained for a balun as in FIG. 6 with four integrated capacitors with a capacitance of about 0.5 pF each. The performance is comparable to that of known baluns using quarter wavelength transmission lines, microstrip lines. The size is however much smaller, in this embodiment, it is smaller than 0.04 mm², which can be compared with baluns based on quarter wavelength transmission lines having a size of at least 0.5 mm² Additionally, by a proper design of the balun and an appropriate choice of the capacitances, the desired pass band of the balun may be shifted within a frequency range. In a particularly advantageous embodiment the adjustment to a desired frequency band may he achieved by replacing the capacitors by varactors.

FIGS. 10A–10D are similar to those of FIGS. 9A–9D but for a balun without any integrated capacitors. It can be seen that there is a shift towards a higher frequency.

Figure 11A:
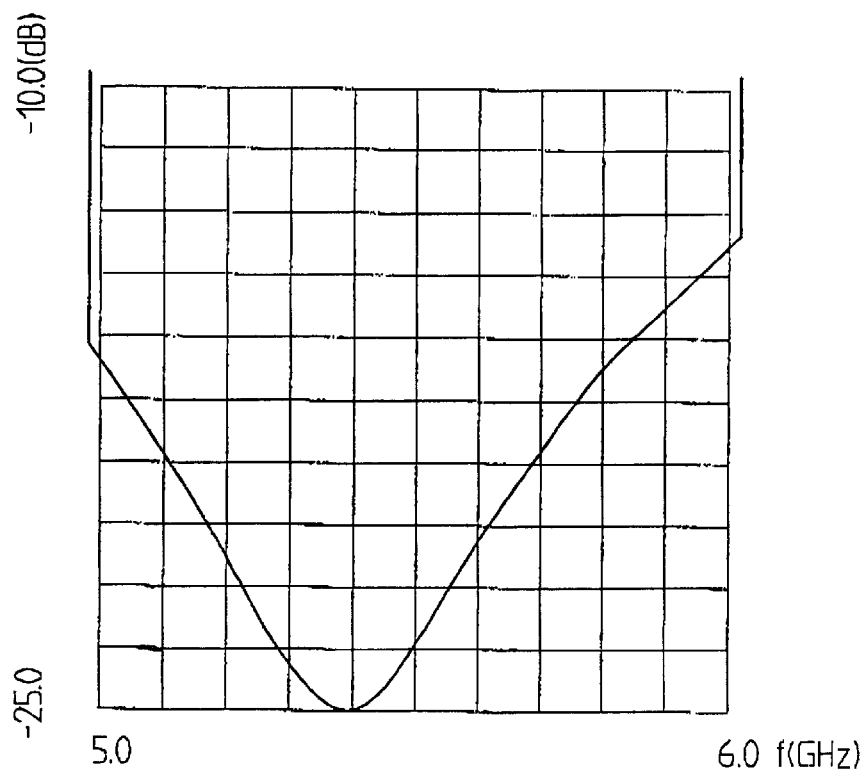
FIG. 11A illustrates the reflection at the balanced part when a signal is sent from the unbalanced side to the balanced side for a balun as in FIG. 6 and with integrated capacitors.
Figure 11B:
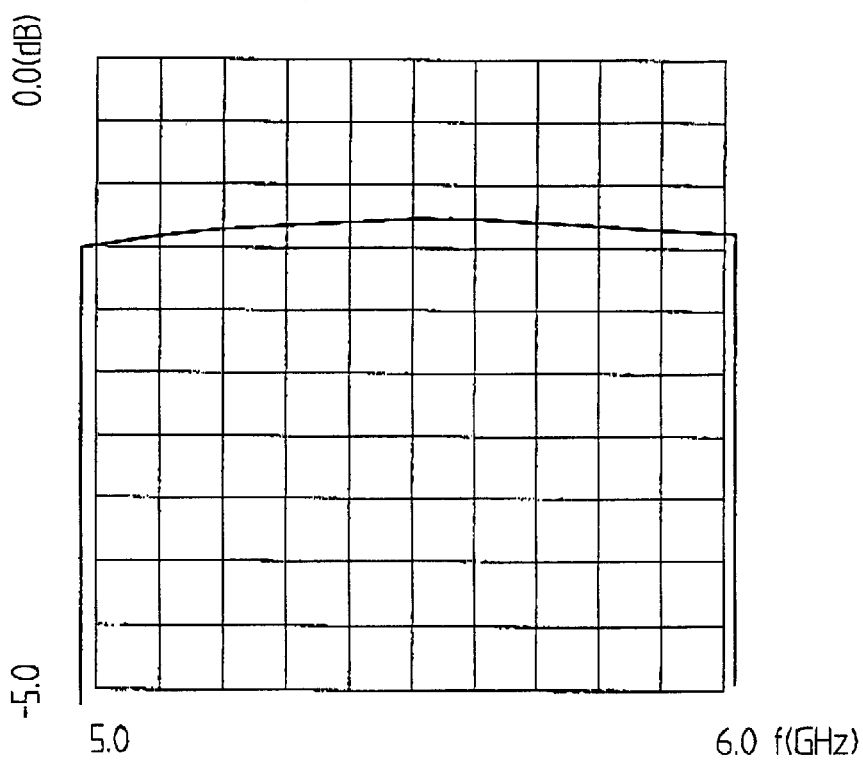
FIG. 11B illustrates the transmission performance for a balun as in FIG. 6.

FIGS. 11A, 11B illustrate the performance in terms of reflection and transmission for a balun as disclosed in FIG. 6, i.e. a balun with coils symmetrical with the respect to the substrate layer. It also comprises integrated capacitors as in FIGS. 9A–9D. The values as disclosed in FIGS. 11A, 11B are obtained with a discrete on-ship balun as in FIG. 6 having an area of 0.09 mm².

It should be clear that the invention is not limited to the explicitly illustrated embodiments but that it can be varied in a number of ways. A balun can be provided wherein each coil is provided in (constitute) a separate metal layer as well as a balun wherein each coil is divided in two portions such that one portion of each coil is provided in one of the metal layers (constitute a portal of the metal layer) whereas the other portion of each coil is provided in the other metal layer (constitute a respective portion of the other metal layer) to make the coils symmetric with the respect to the substrate or to the ground plane. In both cases it is possible to have a balun without any integrated capacitors, or a balun with capacitors integrated in parallel with each one of the terminals, e.g. there may be four capacitors. Alternatively there may be two capacitors or three capacitors each integrated with one of the terminals which is possible since it is a discrete component as opposed to a distributed component. The capacitor or some of the capacitors may also be substituted by variable capacitances i.e. varactors of some kind. Although the illustrated embodiments disclose coils with only one winding turn, it is also possible to use coils having two or three winding turns but generally, ill the most preferred embodiments, each coil comprises but one winding turn. Also in other aspects the invention may be varied in a number ways without departing from the scope of the appended claims.

What is claimed is:

1. A multilayer, balanced-unbalanced signal transformer comprising:

a first coil and a second coil providing at least one balanced signal port at one side of the balun transformer and an unbalanced signal port at another side of the balun transformer, the at least one balanced signal port being provided by a first balanced signal terminal and a second balanced signal terminal formed by the ends of the first coil; the unbalanced signal port being provided by a first unbalanced signal terminal and a second unbalanced signal terminal, wherein the balun transformer is a discrete component formed on a low resistivity substrate layer;

the first and second coils are formed in a first and a second metal layer such that at least a portion of one of the coils is disposed in a metal layer above the metal layer in which at least a portion of the other coil is disposed, wherein between said first and second metal layers and between said second metal layer and the substrate layer, the first and second dielectric layers are disposed; and each of the first and second coils has no more than three winding turns.

2. A balun transformer according to claim 1, wherein each of the first and second coils has one winding turn.

3. A balun signal transformer according to claim 1, wherein the balun transformer is formed directly on the low resistivity substrate layer.

4. A balun transformer according to claim 1, wherein the substrate layer comprises a thin film or bulk semiconductor substrate comprising a MMIC.

5. A balun transformer according to claim 1, wherein the first and second coils are arranged symmetrically with respect to the substrate layer.

6. A balan transformer according to claim 1, wherein each of the first and second coils comprises a first and a second portion respectively and in that the first portions are provided in one of the first and second layers, the second portions being provided in the other of the first and second layers, via connections being used to connect the first and second portions of the respective coils.

7. A balun transformer according to claim 1, wherein a capacitor is integrated in parallel with at least one of the balanced signal terminals.

8. A balun transformer according to claim 7, wherein a capacitor is integrated in parallel with each of the signal terminals.

9. A balun transformer according to claim 1, wherein the balun transformer is an on-chip fabricated balun integrated in a MMIC.

10. A balun transformer according to claim 1, wherein the first and second dielectric layers comprise low loss dielectrics.

11. An arrangement according to claim 6, wherein the first portion of the first coil and the first portion of the second coil are provided in the first layer and the first portions comprise the balanced and unbalanced signal terminals respectively.

12. An arrangement according to claim 6, wherein the first portion of the first coil and the first portion of the second coil are provided in the second layer and in that the first portions comprise the balanced and unbalanced signal terminals respectively.

13. A balun transformer according to claim 1, wherein the distance between opposed branches within the first and second coils respectively is selected such that parasitic currents in the substrate layer are reduced or cancelled.

14. A balun transformer according to claim 7, wherein each capacitor comprises one of a semiconductor varactor, ferroelectric varactor, and a microelectromechanical varactor.

15. A balun transformer according to claim 1, wherein the second unbalanced terminal of the second coil is connected to one of a fixed potential and ground.

16. A balun transformer according to claim 1, wherein the balanced terminals are connected to a balanced transmission line and the unbalanced terminals are connected to an unbalanced transmission line.

17. A balun transformer according to claim 1, wherein the balun transformer has a size of less than about 0.1 mm$^2$.

18. A balun transformer according to claim 1, wherein the balanced terminals are connected to a coplanar strip line and the unbalanced terminals are connected to one of a microstrip line and a coplanar waveguide.

* * * * *